US006486647B1

(12) United States Patent
Obrecht

(10) Patent No.: US 6,486,647 B1
(45) Date of Patent: Nov. 26, 2002

(54) CIRCUIT FOR MONITORING AN ALTERNATIVE CURRENT POWER SWITCH

(75) Inventor: Klaus Obrecht, Baden (DE)

(73) Assignee: Siemens Building Technologies AG, Zug (CH)

( * ) Notice: Subject to any disclaimer, the term of this patent is extended or adjusted under 35 U.S.C. 154(b) by 0 days.

(21) Appl. No.: 09/486,851

(22) PCT Filed: Nov. 6, 1998

(86) PCT No.: PCT/EP98/07086

§ 371 (c)(1), (2), (4) Date: May 17, 2000

(87) PCT Pub. No.: WO99/27552

PCT Pub. Date: Jun. 3, 1999

(30) Foreign Application Priority Data

Nov. 25, 1997 (EP) ........................................... 97120590

(51) Int. Cl.[7] ......................... G01R 19/00; G01R 27/26

(52) U.S. Cl. ..................... 324/76.11; 324/676; 324/678

(58) Field of Search .......................... 324/76.11, 158.1, 324/207, 676, 678

(56) References Cited

U.S. PATENT DOCUMENTS

| | | | | | |
|---|---|---|---|---|---|
| 4,298,334 | A | * | 11/1981 | Clark et al. | 431/45 |
| 4,303,383 | A | * | 12/1981 | Black et al. | 431/46 |
| 4,333,049 | A | * | 6/1982 | Yui et al. | 324/158.1 |
| 5,294,889 | A | * | 3/1994 | Heep et al. | 324/678 |
| 5,420,503 | A | * | 5/1995 | Beha | 324/108 |
| 5,497,380 | A | * | 3/1996 | Bott et al. | 371/24 |
| 5,629,879 | A | * | 5/1997 | Lelle | 371/24 |
| 5,654,644 | A | * | 8/1997 | Zydek et al. | 324/654 |
| 5,811,893 | A | * | 9/1998 | Soyck | 324/207.12 |
| 6,246,333 | B1 | * | 6/2001 | Doner et al. | 324/207.2 |

FOREIGN PATENT DOCUMENTS

| | | | | |
|---|---|---|---|---|
| DE | 38 42 169 A1 | | 6/1990 | |
| DE | 30 44 047 C2 | | 7/1990 | |
| DE | 30 41 521 C2 | | 8/1990 | |
| DE | 41 37 204 A1 | | 4/1993 | |
| EP | 0 660 043 A1 | | 6/1995 | |
| EP | 0 660 044 A1 | | 6/1995 | |
| JP | 05260645 | * | 10/1993 | 324/71.5 |
| JP | 06003425 | * | 1/1994 | 324/418 |

* cited by examiner

*Primary Examiner*—Michael Sherry
*Assistant Examiner*—Jemele Hollington
(74) *Attorney, Agent, or Firm*—Proskauer Rose LLP

(57) ABSTRACT

A circuit (1) for monitoring the state—open or closed—of an ac switch (2) has an input (4) which is connected by way of a diode (9) and a first resistor (10) to a high-ohmic input (11) of a first digital component (12). One terminal of the ac switch (2) is connected to the phase (P) of a mains voltage ($U_{PN}$), while the other terminal is connected to the input (4) of the circuit (1). The high-ohmic input (11) of the first digital component (12) is connected by way of a second resistor (13) to an output (14) of a second digital component (15). In accordance with a predetermined time lapse, the output (14) of the second digital component (15) is either connected to the neutral point (N) of the mains voltage ($U_{PN}$) or carries a voltage which is greater than the threshold voltage ($U_S$) of the input (11) of the first digital component (12).

4 Claims, 4 Drawing Sheets

CIRCUIT FOR MONITORING AN ALTERNATIVE CURRENT POWER SWITCH

FIELD OF THE INVENTION

The invention concerns a circuit for monitoring the state (open or closed) of an ac switch.

BACKGROUND OF THE INVENTION

Switches are used for example in devices for controlling and monitoring the burner and the ignition device of oil-fired and gas-fired systems and for monitoring switches for control members such as fuel valves and air flaps, wherein a microprocessor evaluates the items of information supplied by way of mains voltage-carrying signalling lines and produces suitable control commands. Particularly in regard to the safety aspect which is required in the start-up procedure and in operation of oil and gas burners, the switch-off capability of the switch devices which switch loads which are critical in terms of safety (such as for example a fuel valve) has to be frequently checked in order to be able to detect a malfunction of the switch device before a danger situation arises.

German patent specification No 30 44 047 and German patent specification No 30 41 521 C2 disclose a control arrangement for oil burners, in which items of information about the switching states of relay and sensor contacts are transmitted to a microprocessor by means of amplifiers. The switching states of the relay contacts are supplied by way of mains voltage-carrying signalling lines to respective amplifiers each of which is connected on its output side to an input of the microprocessor so that the latter must have a number of inputs corresponding to the number of amplifiers. Separating members such as for example optocouplers or transformers are used for the galvanic separation of the signalling lines and the microprocessor. In that arrangement, there is one separating member per signal voltage. The microprocessor is programmed to implement a number of checking operations to ascertain whether a system with switched loads is actually passing through a switch-on phase in the correct fashion. For that purpose signals are read in by the microprocessor and compared to reference values. In the event of a defective load state, the microprocessor switches the loads off.

In addition, in an arrangement known from German laid-open application (DE-OS) No 41 37 204 for monitoring ac switches, mains voltage-carrying signalling lines are connected by way of optocouplers to an interrogation unit of an ac voltage detector. In that arrangement the signalling lines are connected to the optocouplers by way of respective low pass members each comprising a resistor and a capacitor connected in series therewith. The switching states of the ac switches are interrogated by way of the signalling lines, and stored. In an evaluation unit connected downstream of the interrogation unit, the switching states are compared to a reference state—open or closed—and in accordance therewith the switch state signal is formed, which contains at least one item of information—error or no error—overall for all ac switches involved. It is not possible to ascertain from the switch state signal which ac switch can no longer be switched off if need be, so that a simple display for diagnosis purposes is not possible.

European patents EP 660 043 and 660 044 also disclose circuits for monitoring ac switches. Those circuits however cannot be checked in a continuous mode in respect of the correct operability of their components which are relevant in terms of safety.

SUMMARY OF THE INVENTION

The object of the invention is to provide a circuit for monitoring an ac switch, with which a load can be switched to a mains voltage, which can be fed opposite the neutral point of the mains voltage and whose components which are relevant in terms of safety can be checked in a continuous mode of operation of the circuit at any time for correct operability thereof.

The invention provides a circuit for monitoring the state—open or closed—of an ac switch of which a first terminal is connected to a phase of a mains voltage, the circuit comprising:

an input which is connectable to a second terminal of the ac switch; and first and second digital components;

wherein the input is connected by way of a diode and a first resistor to a high-ohmic input of the first digital component;

the high-ohmic input of the first digital component is connected by way of a second resistor to an output of the second digital component; and in accordance with a predetermined time lapse, the output of the second digital component either is arranged to be connected to a neutral point of the mains voltage or carries a voltage which is greater than a threshold voltage of the input of the first digital component so that from the signal at an output, associated with the input, of the first digital component it is possible to deduce whether the ac switch is closed and the diode and the second resistor are intact or whether the ac switch is open.

BRIEF DESCRIPTION OF THE DRAWINGS

Advantageous configurations are set forth in the dependent claims.

Preferred embodiments of the invention are described in greater detail hereinafter with reference to the drawings, in which.

DETAILED DESCRIPTION OF THE INVENTION

Figure 1:
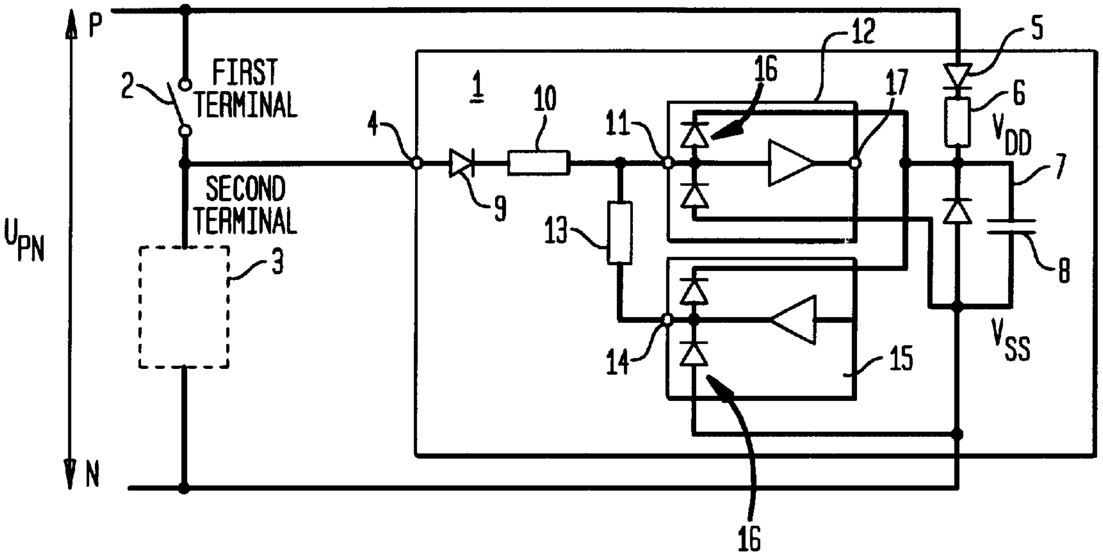
FIG. 1 shows a circuit for monitoring an ac switch.

FIG. 1 shows a circuit 1 for monitoring an ac switch 2. The circuit 1 is fed by a mains voltage $U_{PN}$ between a phase P and a neutral point N. The ac switch 2 can for example as shown in broken line in FIG. 1 connect a load 3 to the mains voltage $U_{PN}$. In that case the ac switch 2 and the load 3 are connected in series, with a terminal of the ac switch 2 being connected to the phase P and a terminal of the load 3 being connected to the neutral point N. The tapping between the ac switch 2 and the load 3 is connected to an input 4 of the circuit 1.

The ac switch 2 however can also be a switch whose position—open or closed—serves as a signalling or control signal. By way of example it may be mentioned that the ac switch 2 could be an overtemperature switch which opens as soon as a predetermined temperature is exceeded, or that the ac switch 2 could be a limit switch which opens (or closes) as soon as an item of equipment reaches a predetermined position. In these cases, the load 3 is simply to be notionally omitted in FIG. 1. In all cases, one terminal of the ac switch 2 is connected to the phase P of the mains voltage $U_{PN}$ and the other terminal is connected to the input 4 of the circuit 1.

The circuit 1 which has the usual feed voltage terminals $V_{DD}$ and $V_{SS}$ is fed by the voltage $U_{PN}$ in known manner, for example with a voltage portion formed from a diode 5, a resistor 6, a Zener diode 7 and a capacitor 8, with the feed voltage terminal $V_{SS}$ being connected to the neutral point N. The feed for the circuit 1 can however also be effected in another fashion, for example by means of a transformer with subsequent rectification, stabilization and galvanic coupling to the neutral point N.

The input 4 is connected by way of a diode 9 and a first resistor 10 to a high-ohmic input 11 of a first digital component 12. A second resistor 13 connects the high-ohmic input 11 to an output 14 of a second digital component 15. The input 11 and the output 14 of the two digital components 12 and 15 respectively are connected as usual by way of protective diodes 16 to the feed voltage $V_{DD}$ and the neutral point N.

For safety reasons component defects are not to have the result that the circuit 1 interprets an open ac switch 2 as being a closed ac switch 2. Therefore all component defects which could lead to a result that is dangerous from the safety point of view must be automatically detected by the circuit 1. Implementation of a component test is provided for that purpose. If for example the diode 9 is short-circuited as a result of a defect, then signals which are coupled in capacitatively at the input 4 of the circuit 1 are not to have the result that the circuit 1 incorrectly signals that the ac switch 2 is closed. An interruption in the resistor 13 also results in a change in the voltage at the input 11 of the first digital component 12. This too is not to lead to a result which is dangerous in safety terms, in respect of the position of the ac switch 2. The resistors 10 and 13 are produced using a technology which, when there is a defect, only permits an interruption but not a short-circuit. It is therefore sufficient for the resistors 10 and 13 to be tested for interruption.

Implementation of an operation of interrogating the position of the ac switch 2 and implementation of a component test relating to the operability of the components 9, 10 and 13 can be effected in processes which are separated in respect of time or by means of a common process.

Figure 2:
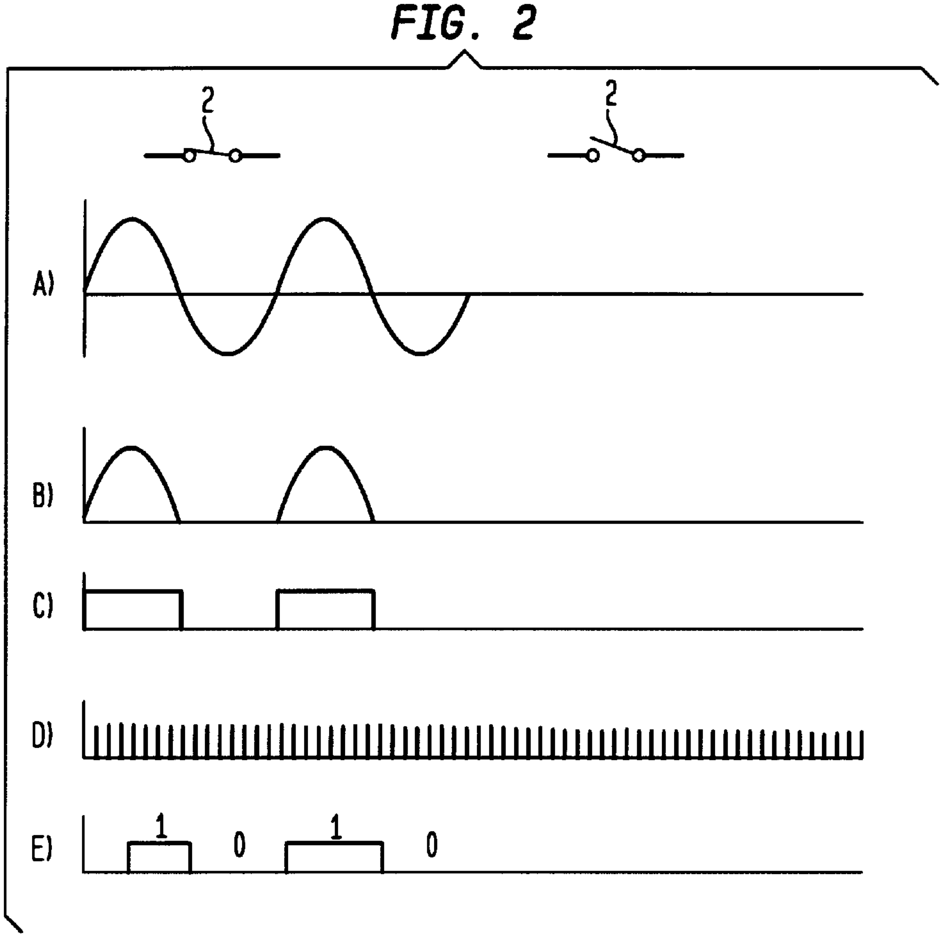
FIGS. 2, 3 and 4 show voltage and signal diagrams.

Interrogation of the state of the ac switch 2—open or closed—, without checking of the components, can be effected by the output 14 of the digital component 15 being connected to the neutral point N. FIG. 2 shows for the two states of the ac switch 2, closed or open, as a function of time t:

a) the voltage configuration at the input of the diode 9, b) the voltage configuration at the output of the diode 9, c) the voltage configuration at the input 11 of the first digital component 12, d) the sampling pulses, and e) binary signals 0 or 1 at the output 17 (FIG. 1) of the first digital component 12, which are produced by sampling of the voltage applied to the input 11 of the first digital component 12, with the sampling pulses.

Because of the protective diodes 16 in the digital components 12 and 15 (FIG. 1), the voltage configuration when the ac switch 2 is closed, at the input 11 of the first digital component 12, is practically rectangular and in phase with the voltage $U_{PN}$. The resistors 10 and 13 act as voltage dividers. At each scanning pulse, there appears at the output 17 of the digital component 12 a binary signal 0 or 1 which specifies whether the voltage at the input 11 is lower or higher than a threshold voltage $U_S$ (for example 2.5 V) which is predetermined by the input 11. Further evaluation of the sampling can be effected for example by summing the signals 0 and 1 respectively which occur during a given period of time, the period of time being longer than half a mains period. When the ac switch 2 is open that sum must give zero. When the ac switch 2 is closed that sum on the one hand must give a finite value which is different from zero, and on the other hand the values of the signal within said period of time must contain both values 0 and also values 1.

In order to execute the component test with which it is possible to check whether the diode 9 is not short-circuited or one of the resistors 10 or 13 is interrupted, a positive voltage which is greater than the threshold voltage $U_S$ is applied to the output 14 of the second digital component 15. If the resistor 13 is intact, then the voltage at the input 11 of the first digital component 12 is also greater than the threshold voltage $U_S$. The period of time during which the positive voltage is applied to the output 14 is greater than a mains half-wave and shorter than a mains full wave. A component fault occurs when the signals appearing at the output 17 of the first digital component 12 do not correspond to the signals expected, as will now be described in greater detail.

Figure 3A:
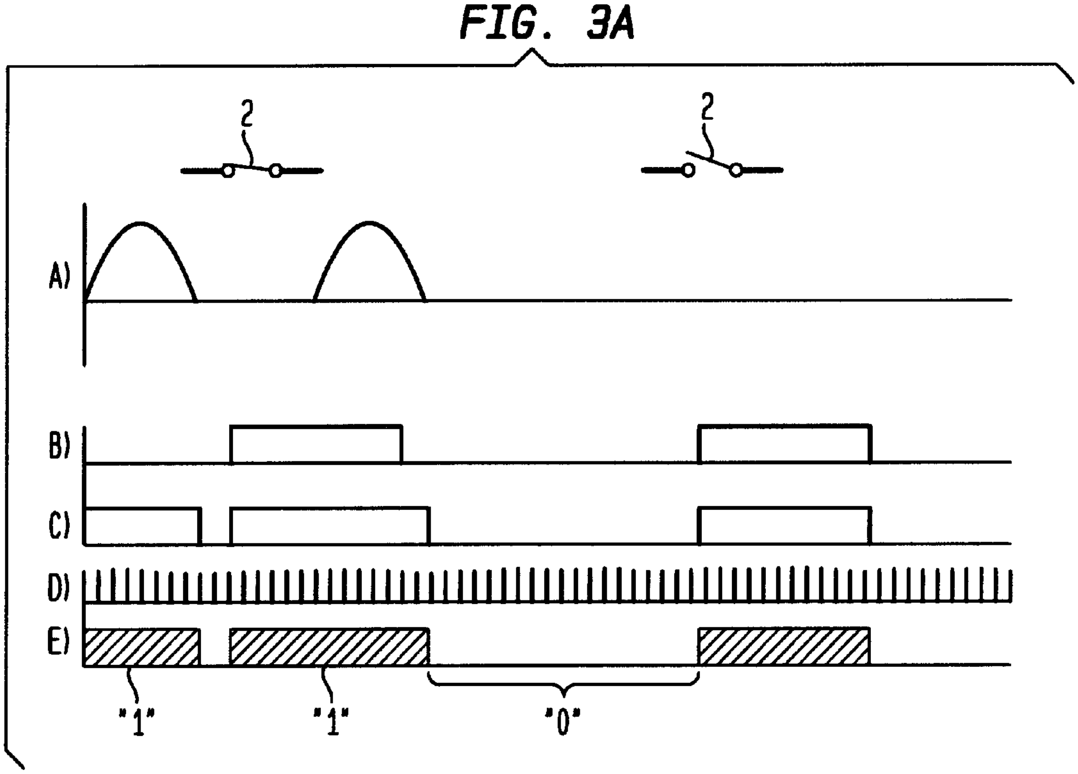
Figure 3B:
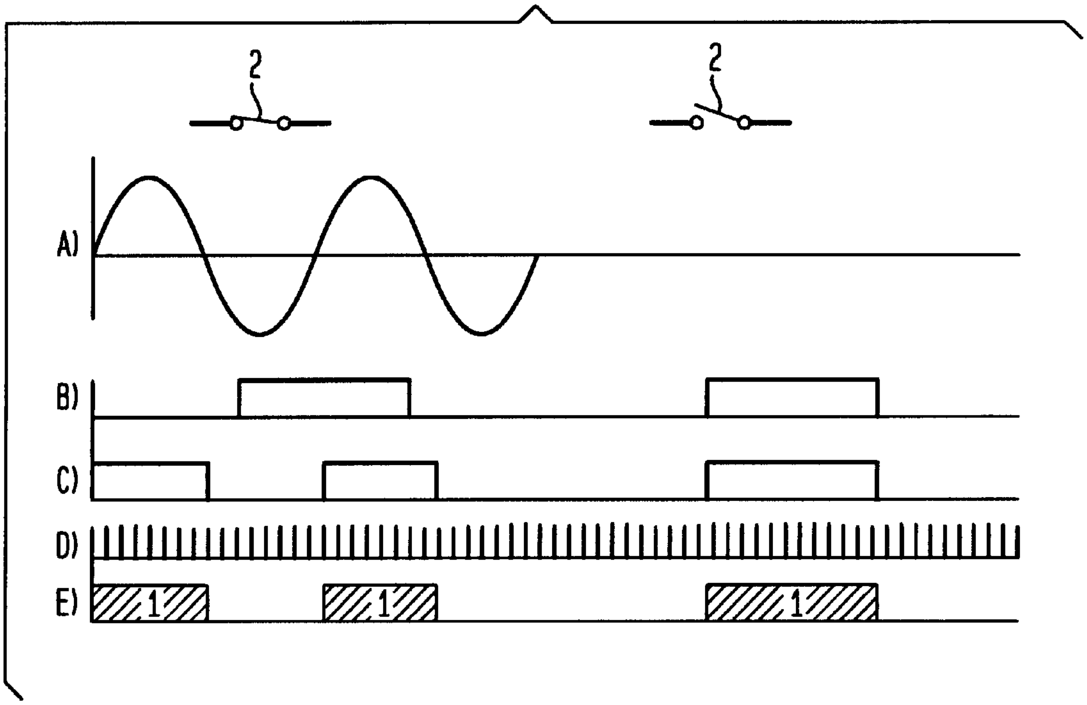

FIGS. 3*a* and 3*b* show for the case of an intact and short-circuited diode 9 respectively, once again for the two states of the ac switch 2, closed and open respectively, as a function of time t:

a) the voltage configuration at the output of the diode 9, b) the voltage configuration at the output 14 of the second digital component 15, c) the voltage configuration at the input 11 of the first digital component 12, d) the sampling pulses, and e) the signals at the output 17 of the first digital component 12.

If the ac switch 2 is closed and the diode 9 and the resistors 10 and 13 are intact (FIG. 3*a*), signals of the value 1 appear at the output 17 of the first digital component 12 when the voltage at the input 11 exceeds the threshold voltage $U_S$, as a consequence of a current positive mains half-wave or as a consequence of a positive voltage at the output 14 of the second digital component 15.

However, in the event of a short-circuit of the diode 9 (FIG. 3*b*), signals of the value 1 appear only during the positive mains half-wave: during the negative mains half-wave the voltage at the input 11 of the first digital component 12 is below the threshold value $U_S$ so that signals of the value 0 appear at the output 17 of the first digital component 12.

If the resistor 10 is interrupted then the voltage at the input 11 of the first digital component 12 is independent of the position of the ac switch 2 and equal to the voltage at the output 14 of the second digital component 15, that is to say signals 1 or 0 which are in phase with the voltage at the output 14 of the second digital component 15 appear at the output 17 of the second digital component 12.

If the resistor 13 is interrupted then the voltage at the input 11 of the first digital component 12 is independent of the voltage at the output 14 of the second digital component 15. The signals at the output 17 of the first digital component 12 are then in phase with the voltage at the input 4 of the circuit 1.

If the ac switch 2 is open, then the voltage at the input 11 of the first digital component 12 only depends on the voltage at the output 14 of the second digital component 15 and whether the resistor 13 is intact or interrupted. If the resistor 13 is intact, then the voltage at the output 17 of the first digital component 12 must be in phase with the voltage at the output 14 of the second digital component 15. If the resistor 13 is interrupted, then only signals 0 may appear at the output 17 of the first digital component 12.

The following Table gives an overview about the various options. The first column symbolically illustrates whether the ac switch 2 is open or closed and whether the diode 9 and the resistor 10 and 13 are or are not intact. The number N in the second column specifies how many signals of the value 1 appear at the output 17 of the first digital component 12 when twenty sampling pulses are provided per mains full wave and when the voltage at the output 14 of the second digital component 15 is above the threshold voltage Us during a period of time which includes fourteen sampling pulses.

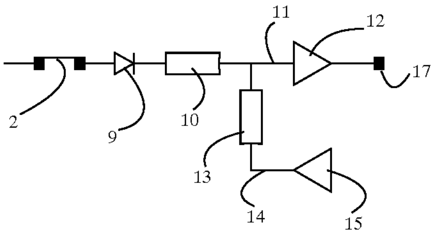

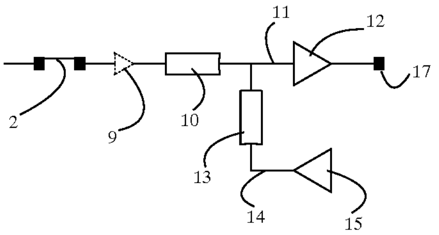

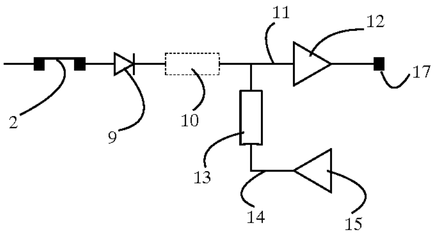

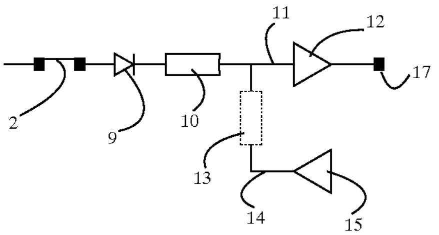

-continued

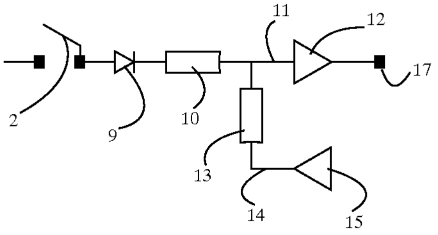

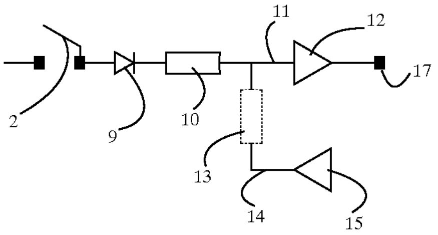

The component test must therefore give a number N which is greater than or equal to 14. If the ac switch 2 is closed then the diode 9 and the resistors 10 and 13 are intact if the number N≧14. If the ac switch 2 is open then only the resistor 13 can be checked. It is intact if the number N=14. If the component test gives a number N which is less than 14, then there is a component fault. If the component test gives a number N which is greater than or equal to 14, then as described above the state—open or closed—of the ac switch 2 can now be established by an interrogation operation in which the output 14 of the second digital component 15 is connected to the neutral point N.

Figure 4:
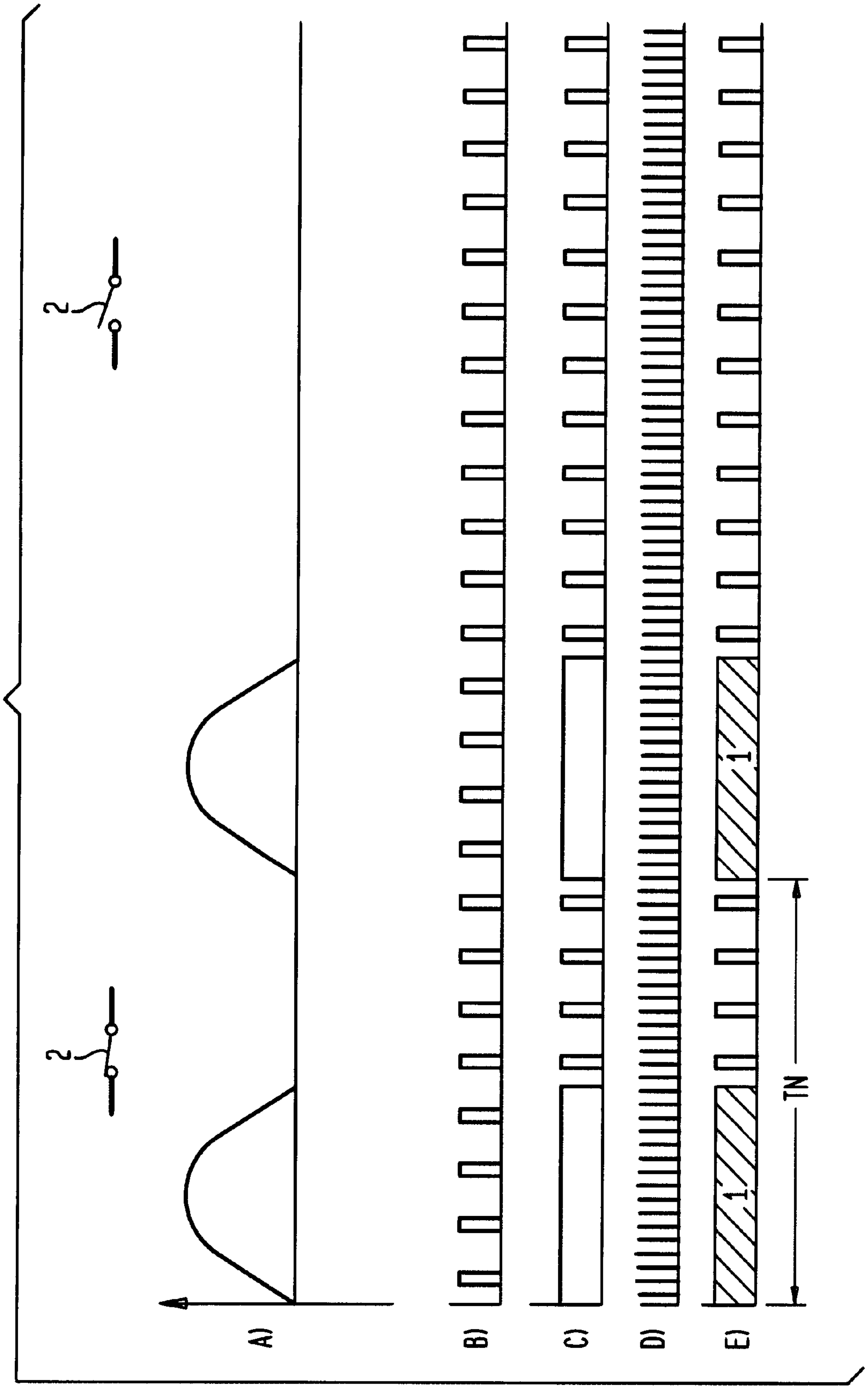

Reference is now made to FIG. 4 to describe an embodiment in which interrogation of the position of the ac switch 2 and checking of the operability of the components are executed in a single process. The output 14 of the second digital component 15 normally carries the level of the neutral point N, but at a frequency R at regular intervals it is set for the duration of a single sampling pulse to a higher level at which the voltage at the input 11 of the first digital component 12 exceeds the threshold voltage $U_S$. During a full mains wave TN, M sampling pulses are generated and the binary sampling values at the output 17 of the first digital component 12 are summed to give the sum Z. The diagrams show for the two states of the ac switch 2, closed and open respectively, as a function of time t:

a) the voltage configuration at the output of the diode 9, b) the voltage configuration at the output 14 of the second digital component 15, c) the voltage configuration at the input 11 of the first digital component 12, d) the sampling pulses, and e) the signals at the output 17 of the first digital component 12.

The following Table shows the possible values of the sum Z and the significance thereof, wherein besides the generally applicable details the Table also sets forth details in respect of the specific example with M=32 and R=8.

| Sum Z | Sum Z for M = 32 and R = 8 | Ac switch 2 | State of the components |
|---|---|---|---|
| Z = 0 | Z = 0 | ? | resistor 13 interrupted |
| Z = R | Z = 8 | open | resistor 13 intact; diode 9 and resistor 10 unknown |
| $Z = \frac{M}{2}$ | Z = 16 | closed | short-circuit of the diode 9 or interruption of the resistor 13; resistor 10 intact |
| $Z = \frac{M}{2} + \frac{R}{2}$ | Z = 20 | closed | diode 9, resistors 10 and 13 intact |
| Z = M | Z = 32 | ? | input 11 or output 14 is permanently connected to $V_{DD}$ |

Z=M/2+R/2 therefore means that the ac switch 2 is "closed" and that the components 9, 10 and 13 are intact. Z=R means that the ac switch 2 is "open", in which case the state of the diode 9 and the resistor 10 cannot be determined. If however in addition whenever the voltage at the output 14 is above the threshold voltage $U_S$, a check is made to ascertain whether the output 17 is carrying the sample value "1", it is then possible to ascertain therefrom whether the diode 9 is short-circuited or the resistor 13 is interrupted. An interruption in the resistor 10 in contrast is always interpreted as ac switch 2 "open". This procedure has the advantage that it is possible within a mains wave to establish whether a safety-compromising component defect is present and what position the ac switch 2 is assuming. From the point of view of safety considerations it can be tolerated if the values for Z deviate by ±1 from the correct value. More specifically there is then no need to synchronize the frequency of the sampling pulses with the mains voltage.

Figure 5:
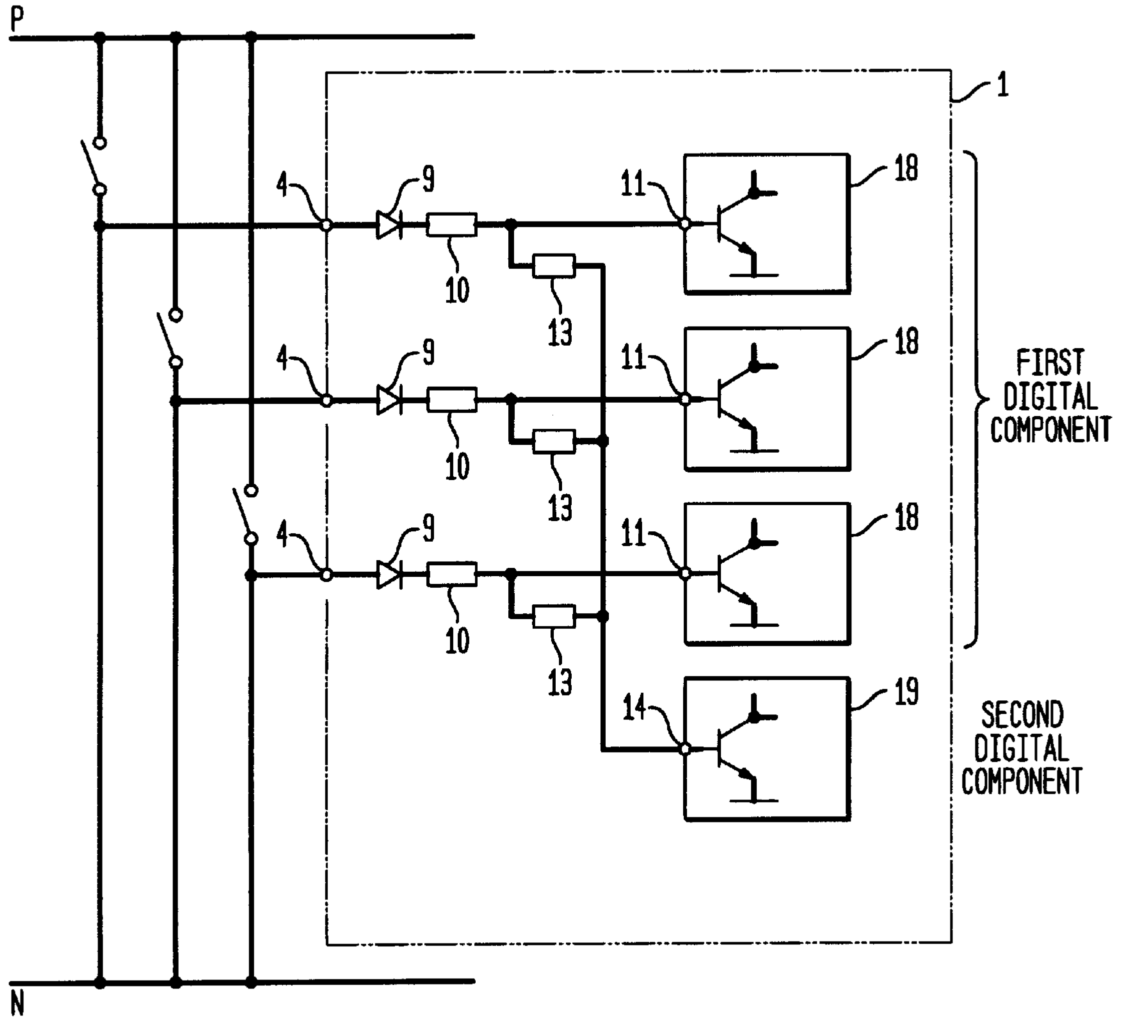
FIG. 5 shows a first expansion of the circuit.

FIG. 5 shows an expansion of the circuit 1 with which a plurality of ac switches 2 can be monitored. The particularity of this circuit is that the second resistors 13 are all taken to a common output 14. Instead of the digital components 12, 15 (FIG. 1) which could be used, transistor stages 18, 19 are used here.

Figure 6:
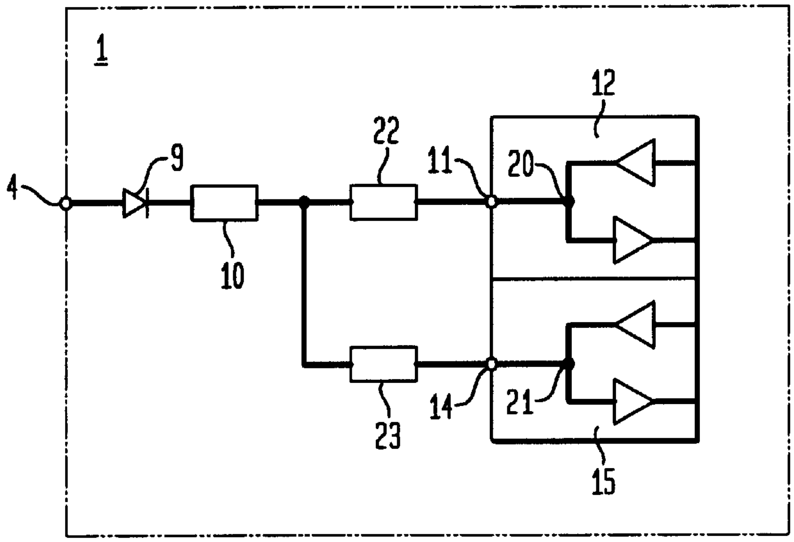
FIG. 6 shows a second expansion of the circuit.

FIG. 6 shows an expansion of the circuit 1 in which the input 11 of the first digital component 12 can also be connected as an output and the output 14 of the second digital component 15 can also be connected as an input. The input 11 and the output 14 are therefore bi-directional ports 20, 21. The terminal of the first resistor 10 is now connected to the first port 20 by way of a resistor 22 and to the second port 21 by way of a further resistor 23. The circuit configuration in regard to the ports 20, 21 is therefore symmetrical so that the function of the ports 20, 21—"input" or "output"—is interchangeable. Therefore repetition of the tests, with the circuitry of the two ports 20, 21 being interchanged as input and output respectively, means that it is also possible to check the operability of the digital components 12 and 15.

The circuit 1 (FIGS. 1 and 6) affords the advantage over known circuits that, when the ac switch 2 is open, it is possible to suppress ac voltages which are coupled in capacitatively, as a consequence of parasitic line capacitances. The coupled-in ac voltage is rectified by the diode 9. The line capacitances are polarized thereby so that the coupled-in ac voltage is shifted in dc-terms by the peak value of the coupled-in ac voltage. The diode 9 is arranged in such a way that the coupled-in ac voltage has a negative dc voltage component. Ac voltages which are coupled-in capacitatively cannot therefore influence the signals at the output 17 of the first digital component 12.

What is claimed is:

1. A circuit for monitoring the state—open or closed—of an ac switch of which a first terminal is connected to a phase of a mains voltage, and a second terminal is connected to an input of the circuit, the circuit comprising:

first and second digital components;

wherein the input of the circuit is connected by way of a diode and a first resistor to a high-ohmic input of the first digital component, the high-ohmic input of the first digital component is connected by way of a second resistor to an output of the second digital component, and wherein in accordance with a predetermined time lapse, the output of the second digital component either is to be connected to a neutral point of the mains voltage or carries a voltage which is greater than a threshold voltage of the input of the first digital component, so that from the signal at an output of the first digital component it is determined whether the ac switch is closed and the diode and the second resistor are intact, or whether the ac switch is open.

2. A circuit as set forth in claim 1, for monitoring a plurality of ac switches, wherein there is a plurality of the first digital components, each having its high-ohmic input arranged to be associated with a respective second terminal of the ac switches, and the output of the second digital component serves as a common output for all of the ac switches.

3. A circuit as set forth in claim 1, wherein the input of the first digital component and the output of the second digital component are bi-directional ports.

4. A circuit as set forth in claim 1, wherein transistor stages are used instead of the digital components.

* * * * *